US012813138B2

(12) United States Patent
Yan et al.

(10) Patent No.: US 12,813,138 B2
(45) Date of Patent: Nov. 24, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Hailong Yan, Beijing (CN); Kai Zhang, Beijing (CN); Erlong Song, Beijing (CN); Guodong Sun, Beijing (CN); Kunyan Shi, Beijing (CN); Zaiyong Long, Beijing (CN); Dongjie Wu, Beijing (CN); Huaping Sun, Beijing (CN); Jingli Zhang, Beijing (CN)

(73) Assignees: CHENGDU BOE OPTOELECTRONICS TECHNOLOGY CO., LTD., Chengdu (CN); Beijing BOE Technology Development Co., Ltd., Beijing (CN)

( * ) Notice: Subject to any disclaimer, the term of this patent is extended or adjusted under 35 U.S.C. 154(b) by 357 days.

(21) Appl. No.: 18/579,052

(22) PCT Filed: Apr. 26, 2023

(86) PCT No.: PCT/CN2023/090861

§ 371 (c)(1),
(2) Date: Jan. 12, 2024

(87) PCT Pub. No.: WO2024/221276

PCT Pub. Date: Oct. 31, 2024

(65) Prior Publication Data

US 2025/0127014 A1 Apr. 17, 2025

(51) Int. Cl.
*H10K 59/80* (2023.01)
*H10K 59/122* (2023.01)

(52) U.S. Cl.
CPC ......... *H10K 59/873* (2023.02); *H10K 59/122* (2023.02)

(58) Field of Classification Search
None
See application file for complete search history.

(56) References Cited

U.S. PATENT DOCUMENTS

2018/0159074 A1 6/2018 Kim et al.
2020/0119123 A1 4/2020 Okabe et al.
(Continued)

FOREIGN PATENT DOCUMENTS

CN 108155216 A 6/2018
CN 111149431 A 5/2020
(Continued)

*Primary Examiner* — Alexander G Ghyka
(74) *Attorney, Agent, or Firm* — Muncy, Geissler, Olds & Lowe, P.C.

(57) ABSTRACT

A display substrate and a display device are disclosed, relating to the technical field of displaying. The display substrate includes: a base substrate including a display region and a frame region surrounding the display region; a first dam portion, located at the frame region and surrounding the display region; and a second dam portion, located at the frame region. A maximum width of the second dam portion in a direction perpendicular to an extension direction of the second dam portion is less than a maximum width of the first dam portion in a direction perpendicular to an extension direction of the first dam portion, and the second dam portion is located at a side of the first dam portion adjacent to the display region. A narrow frame of the display substrate can be realized while ensuring the encapsulating performance.

19 Claims, 8 Drawing Sheets

(56) References Cited

U.S. PATENT DOCUMENTS

| | | | |
|---|---|---|---|
| 2021/0083226 | A1 | 3/2021 | Okabe et al. |
| 2023/0011418 | A1 | 1/2023 | Long et al. |

FOREIGN PATENT DOCUMENTS

| | | | |
|---|---|---|---|
| CN | 111192976 | A | 5/2020 |
| CN | 111900265 | A | 11/2020 |
| CN | 112181204 | A | 1/2021 |
| CN | 113224084 | A | 8/2021 |
| CN | 216749900 | U | 6/2022 |
| CN | 218244273 | U | 1/2023 |

DISPLAY SUBSTRATE AND DISPLAY DEVICE

CROSS-REFERENCE TO RELATED APPLICATIONS

The present application is the U.S. national phase of PCT Application No. PCT/CN2023/090861 filed on Apr. 26, 2023, which is hereby incorporated by reference in its entirety.

TECHNICAL FIELD

The present disclosure relates to the technical field of displaying, and in particular, to a display substrate and a display device.

BACKGROUND

The organic light-emitting diode (OLED) display substrate is widely used in various fields due to its advantages such as light and thin, high brightness, low power consumption, fast response, high definition, good flexibility and high luminous efficiency. However, although the OLED display substrate has various advantages as mentioned above, a conventional OLED display substrate may a wider frame, and the wider frame of the display substrate may affect the user experience. Therefore, there is an urgent need for a display substrate having a narrow frame.

SUMMARY

Embodiments of the present disclosure provide a display substrate and a display device, when can enable a narrow frame of the display substrate while ensuring encapsulating performance.

In order to achieve this, the embodiments of the present disclosure provide the following technical solutions.

In an aspect, a display substrate is provided, including:

- a base substrate, where the base substrate includes a display region and a frame region surrounding the display region;
- a first dam portion, located at the frame region and surrounding the display region; and
- a second dam portion, located at the frame region, where a maximum width of the second dam portion in a direction perpendicular to an extending direction of the second dam portion, is less than a maximum width of the first dam portion in a direction perpendicular to an extending direction of the first dam portion, and the second dam portion is located at a side of the first dam portion adjacent to the display region.

In some embodiments, a low-voltage signal line VSS is arranged at the frame region, the frame region includes a first region and a second region, an end portion of the low-voltage signal line VSS is located at the first region and the second region, the first region and the second region are symmetrical with respect to the display region, and the second dam portion includes a first dam structure arranged at the first region and/or the second region.

In some embodiments, the frame region further includes a third region located between the first region and the second region, and the second dam portion further includes a second dam structure extending from the first region to the second region via the third region.

In some embodiments, the display substrate includes a pixel definition layer, an orthographic projection of the pixel definition layer onto the base substrate does not overlap with a partial area of the first region; and/or The orthographic projection of the pixel definition layer onto the base substrate does not overlap with a partial area of the second region.

In some embodiments, the first region includes a first sub-region where the first dam structure is located and a second sub-region outside the first sub-region, and the orthographic projection of the pixel definition layer onto the base substrate does not overlap with the second sub-region; and/or

- the second region includes a third sub-region where the first dam structure is located and a fourth sub-region outside the third sub-region, and the orthographic projection of the pixel definition layer onto the base substrate does not overlap with the fourth sub-region.

In some embodiments, an extending direction of the second dam structure is parallel or substantially parallel to an extending direction of the first dam portion at the third region.

In some embodiments, the end portion of the VSS includes a first edge at a side adjacent to the first dam portion, the first dam structure includes a first portion, an orthographic projection of the first portion onto the base substrate covers an orthographic projection of the first edge onto the base substrate, and an extending direction of the first portion is parallel or substantially parallel to an extending direction of the first edge.

In some embodiments, the end portion of the VSS includes a second edge at a side adjacent to the third region, the first dam structure includes a second portion, an orthographic projection of the second portion onto the base substrate covers an orthographic projection of the second edge onto the base substrate, and an extending direction of the second portion is parallel or substantially parallel to an extending direction of the second edge.

In some embodiments, a gap portion is arranged at a side of the end portion of the VSS adjacent to the third region, the first dam structure includes a third portion, an orthographic projection of the third portion onto the base substrate covers an orthographic projection of a third edge of the gap portion onto the base substrate, and an extending direction of the third portion is parallel or substantially parallel to an extending direction of the third edge.

In some embodiments, the gap portion includes a fourth edge and a fifth edge which are parallel or substantially parallel to the first dam portion, and the second dam structure includes a fourth portion extending in an extending direction of the fourth edge and/or a fifth portion extending in an extending direction of the fifth edge.

In some embodiments, the gap portion is rectangular.

In some embodiments, a width of the gap portion ranges from 10 micrometers to 60 micrometers, and a length of the gap portion ranges from 200 micrometers to 5000 micrometers.

In some embodiments, a height of the second dam portion in a direction perpendicular to the base substrate is less than or equal to a height of the first dam portion in the direction perpendicular to the base substrate.

In some embodiments, the display substrate includes a first planarization layer, a second planarization layer, a pixel definition layer and a spacer which are located at the frame region and stacked in sequence; and the second dam portion is formed by the first planarization layer, the second planarization layer, and the pixel definition layer; or the second dam portion is formed by the first planarization layer, the second planarization layer, the pixel definition layer, and the spacer.

In some embodiments, the maximum width of the first dam portion in the direction perpendicular to the extending direction of the first dam portion from 30 micrometers to 50 micrometers, and the maximum width of the second dam portion in the direction perpendicular to the extending direction of the second dam portion ranges from 10 micrometers to 50 micrometers.

In some embodiments, the maximum width of the second dam portion in the direction perpendicular to the extending direction of the second dam portion ranges from 15 micrometers to 30 micrometers.

In some embodiments, a length of the first dam structure is greater than 2000 micrometers.

Embodiments of the present disclosure further provide a display substrate, including:

- a base substrate, where the base substrate includes a display region and a frame region surrounding the display region;
- a first dam portion, located at the frame region and surrounding the display region; where
- a low-voltage signal line, arranged at the frame region, where the frame region includes a first region and a second region, an end portion of the low-voltage signal line is located at the first region and the second region, the first region and the second region are symmetrical with respect to the display region, the frame region further includes a third region located between the first region and the second region, and the low-voltage signal line is not arranged at the third region; and
- a second dam portion, at least located at the first region, the second region and/or the third region, where the second dam portion is located at a side of the first dam portion adjacent to the display region.

In some embodiments, a maximum width of the second dam portion in a direction perpendicular to an extending direction of the second dam portion is less than a maximum width of the first dam portion in a direction perpendicular to an extending direction of the first dam portion; and/or

- a length of the second dam portion in the extending direction of the second dam portion is less than a length of the first dam portion in the extending direction of the first dam portion.

Embodiments of the present disclosure further provides a display device, including the display substrate as described above.

REFERENCE NUMERALS

Figure 1:
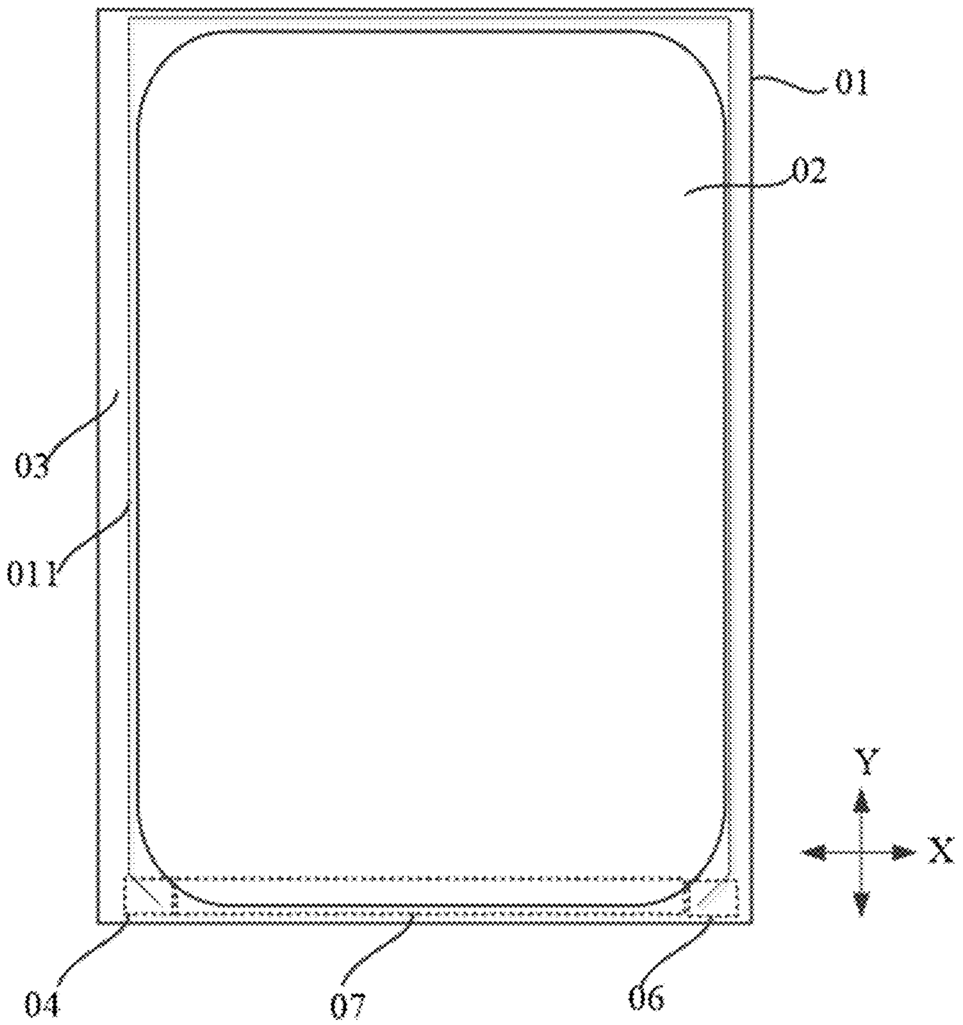
FIG. 1 is a top view of a display substrate.

01 Display substrate
02 Display region
03 Frame region
04 First region
06 Second region
07 Third region
011 VSS
012 Pixel definition layer
013 First dam portion
014 Water vapor intrusion channel
015 Second dam portion
016 Base substrate
017 First planarization layer
018 Second planarization layer
019 Spacer
020 Gap portion
0201 Third edge
0151 First dam structure
0152 Second dam structure
0111 First edge
0112 Second Edge
01511 First portion
01512 Second portion
0201 Third edge
02014 Fourth edge
02015 Fifth edge
01513 Third portion
01524 Fourth portion
01525 Fifth portion

DETAILED DESCRIPTION

To make technical issues to be addressed, technical solutions, and advantage of embodiments of the present disclosure clearer, a detailed description will be given hereinafter with reference to the accompanying drawings and specific embodiments.

The embodiments of the present disclosure will now be described clearly hereinafter with reference to the accompanying drawings. Apparently, the described embodiments are merely some, but not all embodiments of the disclosure. Based on the embodiments provided by the present disclosure, all other embodiments available to a person skilled in the art are within the scope of the present disclosure.

Unless the context requires otherwise, throughout the specification and claims which follow, the word "comprise" and variations thereof, such as, "comprises" and "comprising" are to be construed in an open, inclusive sense, that is as "including, but not limited to". Throughout the description, the terms "one embodiment", "some embodiments", "exemplary embodiments", "example", "specific example", or "some examples" and the like are intended to indicate that a particular feature, structure, material, or characteristic described in connection with the embodiment or example is included in at least one embodiment or example of the present disclosure. The schematic representations of the above terms do not necessarily refer to the same embodiment or example. Furthermore, the particular feature, structure, material, or characteristic described may be included in any suitable manner in any one or more embodiments or examples.

Hereinafter, the terms "first" and "second" are used for descriptive purposes only and are not to be understood as indicating or implying relative importance or implicitly indicating the number of technical features indicated. Thus, a feature defined as "first" or "second" may explicitly or implicitly comprise one or more of the features. In the description of the embodiments of the present disclosure, the meaning of "a plurality" is two or more unless otherwise specified.

In describing some embodiments, the expressions "couple" and "connect", along with their derivatives, may be used. For example, when describing some embodiments, the term "connect" may be used to indicate that two or more elements are in direct physical or electrical contact with each other. As another example, when describing some embodiments, the term "couple" may be used to indicate that two or more elements are in direct physical or electrical contact. However, the terms "couple" or "communicatively couple" may also mean that two or more elements are not in direct contact with each other, but still co-operate or interact with each other. The embodiments disclosed herein are not necessarily limited in this context.

"At least one of A, B and C" has the same meaning as "at least one of A, B or C" and includes the following combinations of A, B and C: A only, B only, C only, a combination of A and B, a combination of A and C, a combination of B and C, and a combination of A, B, and C.

"A and/or B" includes the following three combinations: A only, B only, and combinations of A and B.

As used herein, depending on the context, the term "if" may be interpreted to mean "when" or "while" or "in response to a determination . . . " or "in response to a detection . . . ". Similarly, depending on the context, the phrases "if determining . . . " or "if [recited condition or event] is detected" may be interpreted to mean "upon a determination . . . " or "in response to a determination . . . " or "upon a detection of [recited condition or event]" or "in response to a detection of [recited condition or event]".

The use of "adapted to" or "configured to" herein means an open and inclusive language which does not exclude the device is further adapted or configured to perform additional tasks or steps.

In addition, the use of "based on" means an open and inclusive limitation in which a process, step, calculation, or other action "based on" one or more of the stated conditions or values may also be based on additional conditions or beyond the stated values in actual practice.

As used herein, terms "about", "substantially", or "approximately" include the stated value as well as an average value within an acceptable deviation range of a particular value, where the acceptable deviation range is determined by a person skilled in the art in view of the measurement in question and the measurement error associated with the particular quantity (i.e., the limitations of the measurement system).

Exemplary embodiments are described herein with reference to cross-sectional and/or plan views which are ideal exemplary figures.

In the drawings, the thickness of layers and regions may be enlarged for clarity. Thus, variations in shape relative to the drawings due to, for example, manufacturing techniques and/or tolerances, may be contemplated. Thus, the exemplary embodiments should not be construed as limited by the shapes of regions illustrated herein, but include deviations in shapes that may be caused, for example, by the manufacturing. For example, an etched area shown as a rectangle may generally have a curved feature. Thus, regions shown in the figures are schematic in nature and their shapes are not intended to illustrate an actual shape of a region of a device and are not intended to limit the scope of the exemplary embodiments.

At present, in the process of encapsulating an OLED display screen, an organic encapsulation material in an encapsulation structure is generally fabricated by using an Ink Jet Printing (IJP) technique. Since an ink used to fabricate the organic encapsulation structure is flowable, the overflow of the ink should be prevented to ensure the yield of the IJP. In some embodiments, the display substrate includes a display region and a frame region, and two rings of dam portions (Dam) surrounding the display region are provided in the frame region to block the overflowed ink from the display region after the IJP is performed.

However, the inventors of the present disclosure found that: providing two rings of Dams in the frame region increases the size of the frame region, which is not favorable for the narrow frame design of the display substrate.

In general, in a case that a frame distance (namely, a width of the frame region outside the display region) is greater than 700 micrometers, a structure including two rings of dams is adopted, which can facilitate the levelling of the IJP. In a case that the frame distance is less than 700 micrometers, the frame can be referred to as a narrow frame. Generally, only one ring of dam is arranged in the frame region in this case. However, for the single ring of dam, the capability for preventing the water vapor intrusion and the overflow is weaker when compared with those of two rings of dams. As a result, during the REL (reliability) process, there is a high risk for the water vapor intrusion, resulting in an abnormal displaying of the display substrate.

FIG. 1 is a top view of a display substrate according to some embodiments. As shown in FIG. 1, the display substrate 01 includes a display region 02 configured for displaying an image and a frame region 03 that does not display the image. The frame region 03 surrounds at least one side of the display region 02. In some examples, the frame region 03 may enclose the display region 02 and may be located outside the display region 02 in at least one direction.

The display substrate 01 may have a rectangular shape in plan view, or may have a circular shape, an oval shape, a diamond shape, a trapezoidal shape, a square shape, or other shapes according to requirements for displaying.

The display substrate 01 may be applied to various display devices, for example, small and medium-sized electronic devices such as a tablet computer, a smart phone, a head mounted display, a car navigation unit, a camera, a central information display (CID) provided in a vehicle, a watch-type electronic device or other wearing equipment, a personal digital assistant (PDA), a portable multimedia player (PMP), and a game machine, as well as large or medium-sized electronic devices such as a television, an external billboard, a monitor, a home appliance including a display screen, a personal computer, and a laptop computer. The electronic device as described above may represent mere examples to which the display device is applied, and a person skilled in the art may recognize that the display substrate 01 may also be applied to other display devices without departing from the spirit and scope of the present disclosure.

As shown in FIG. 1, a frame region 03 is provided with a low-voltage signal line VSS 011, the low-voltage signal line VSS 011 extends from a first region 04 to a second region 06. Namely, an end portion of the low-voltage signal line VSS 011 is located at the first region 04 and the second region 06, the first region 04 and the second region 06 belong to the frame region 03, and the first region 04 and the second region 06 are symmetrical with respect to a display region 02. The frame region 03 further includes a third region 07 located between the first region 04 and the second region 06, and the low-voltage signal line VSS 011 is not provided in the third region 07.

Figure 2:
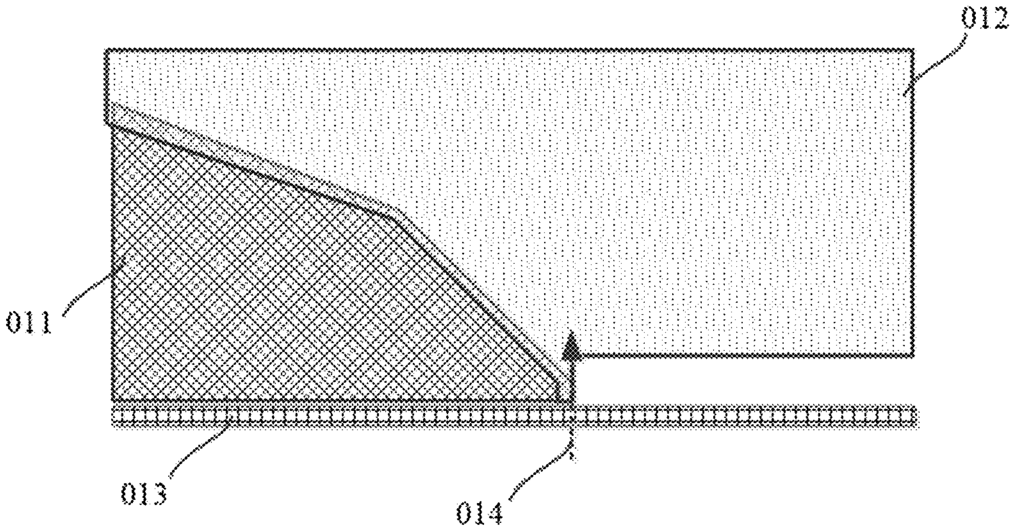
FIG. 2 is a schematic view showing a water vapor intrusion of a display substrate in the related art.

FIG. 2 is a schematic enlarged view of the first region 04 in FIG. 1. As shown in FIG. 2, the frame region 03 is provided with a first dam portion 013 surrounding the display region 02. When encapsulating the display substrate, the first dam portion 013 can block the ink for fabricating the organic encapsulation structure from overflowing. The VSS 011 is generally made of Ag and ITO. After the VSS 011 is formed, Ag particles tend to remain at an edge of the VSS 011. In order to avoid that the Ag particles at the edge of the VSS 011 are flushed to the display region 02 in a subsequent cleaning process and thus resulting in a risk of dark spot, the edge of the VSS 011 is covered by a pixel definition layer 012. The pixel definition layer 012 is generally made of an organic insulating material. In an environment of an encapsulating reliability test which has a high-temperature and high-humidity, the organic insulating material tends to absorb water vapor. A water vapor intrusion channel 014 as shown by a dotted line in the figure may be formed at the edge of the VSS 011, thereby reducing the encapsulating reliability of the display substrate.

Figure 3:
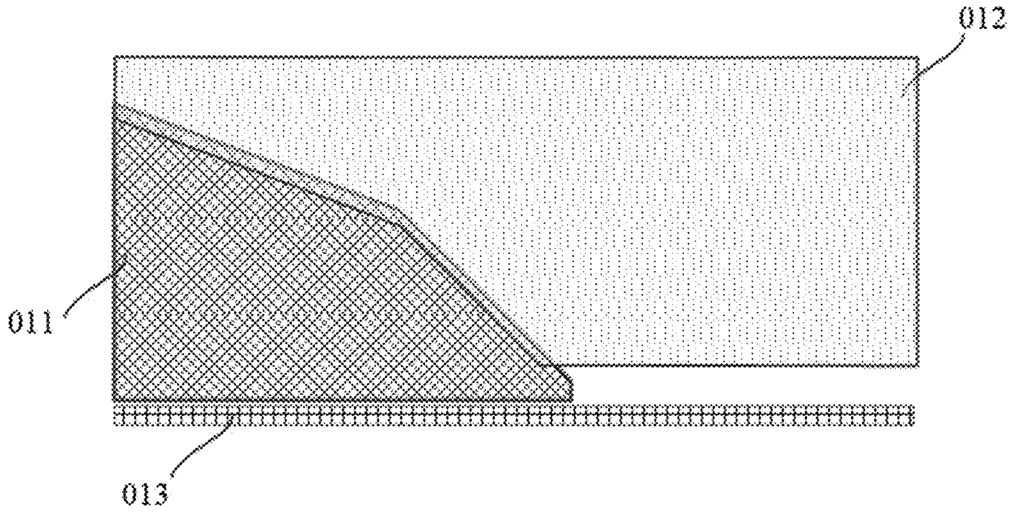
FIG. 3 is a schematic view in which a part of a pixel definition layer is removed.

In order to improve the encapsulating reliability of the display substrate, as shown in FIG. 3, the pixel definition layer 012, which is located at the position where the water vapor intrusion channel 014 is located in FIG. 2, may be removed, so that the water vapor intrusion channel 014 cannot be formed. However, the VSS 011 is not covered by the pixel definition layer 012 at this position, and Ag particles may easily residues at the edge of the VSS 011, which may be flushed to the display region 02 in the subsequent cleaning process, and thus resulting in the risk of dark spot.

Embodiments of the present disclosure provide a display substrate and a display device, which can ensure encapsulating performance while realizing a narrow frame of the display substrate.

Embodiments of the present disclosure provide a display substrate 01, as shown in FIGS. 4-16, the display substrate 01 includes:

- a base substrate, where the base substrate includes a display region 02 and a frame region 03 surrounding the display region 02;
- a first dam portion 013, located at the frame region 03 and surrounding the display region 02; and
- a second dam portion 015, located at the edge frame region 03, where a maximum width of the second dam portion 015 in a direction perpendicular to an extending direction of the second dam portion is less than a maximum width of the first dam portion 013 in a direction perpendicular to an extending direction of the first dam portion, and the second dam portion 015 is located at a side of the first dam portion 013 adjacent to the display region 02.

In the present embodiment, in addition to the first dam portion 013, the second dam portion 015 is also provided, and the encapsulating reliability of the display substrate can be improved by providing two rings of dam portions. Moreover, the maximum width of the second dam portion 015 in the direction perpendicular to the extending direction of the second dam portion is less than the maximum width of the first dam portion 013 in the direction perpendicular to the extending direction of the first dam portion, which is favorable for the narrow frame of the display substrate.

In order to realize the narrow frame of the display substrate, a minimum distance between the first dam portion 013 and the second dam portion 015 may range from 10 micrometers to 20 micrometers, such as 10 micrometers, 11 micrometers, 12 micrometers, 13 micrometers, 14 micrometers, 15 micrometers, 16 micrometers, 17 micrometers, 18 micrometers, 19 micrometers, or 20 micrometers.

In some embodiments, the first dam portion 013 surrounds at least one side of the display region 02. In some examples, the first dam portion 013 may enclose the surrounding display region 02; the second dam portion 015 surrounds at least one side of the display region 02. In some examples, the second dam portion 015 may enclose the display region 02, so that the encapsulating reliability of the display substrate can be maximized.

In order to make the frame of the display substrate narrower, the second dam portion 015 may be provided only in an area where the water vapor intrusion is likely to occur.

Figure 4:
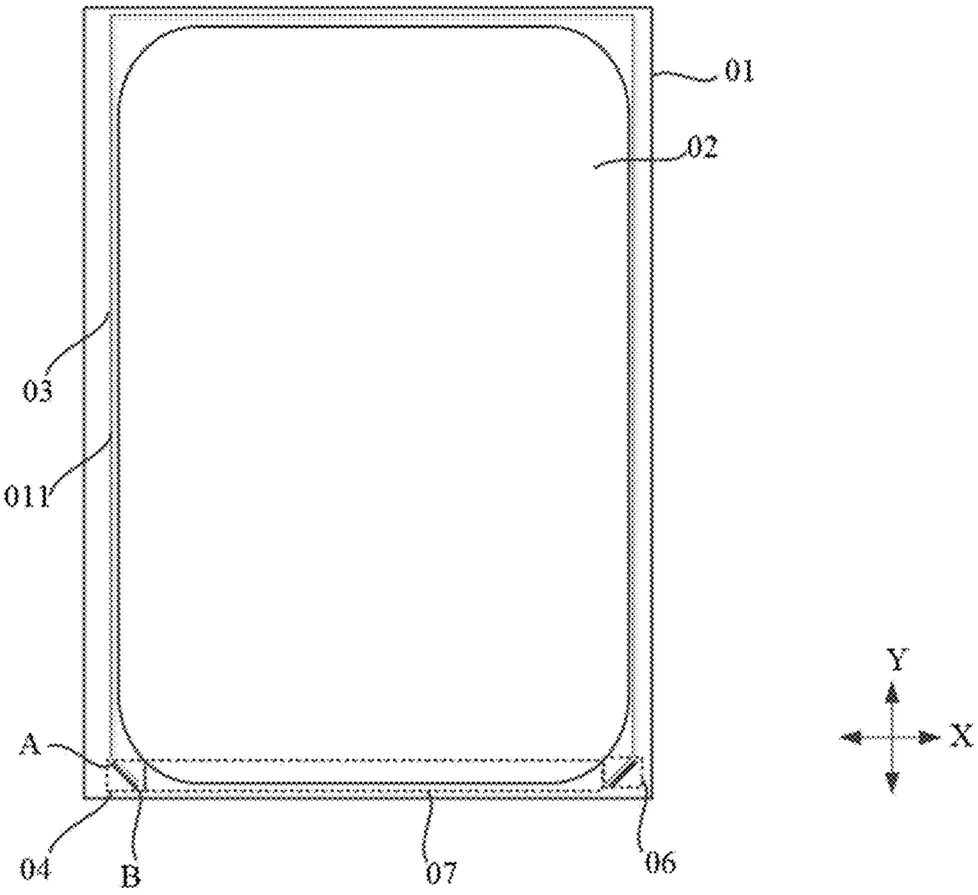
FIGS. 4 and 5 are schematic plan views showing display substrates according to embodiments of the present disclosure.

As shown in FIG. 4, the frame region 03 is provided with a low-voltage signal line VSS 011. It is found that in an encapsulating reliability test, there is a relative high risk for the water vapor intrusion occurring in a region (a first region 04 and a second region 06) where an end portion of the VSS 011 is located. In order to make the frame of the display substrate narrower, as shown in FIG. 4, the second dam portion 015 may be provided only in the first region 04 and the second region 06, where the second dam portion 015 in the first region 04 and the second region 06 is referred to as a first dam structure 0151. In this embodiment, an explanation is given by taking the first region 04 as an example, and the first dam structure 0151 in the second region 06 and the first dam structure 0151 in the first region 04 may be symmetrically arranged with respect to a central axis of the display region in an Y direction. Alternatively, the first dam structure 0151 may be provided only in the first region 04, or the first dam structure 0151 may be provided only in the second region 06. In the first region 04, "A" denotes a starting position of the first dam structure 0151, and "B" denotes an ending position of the first dam structure 0151.

Figure 5:
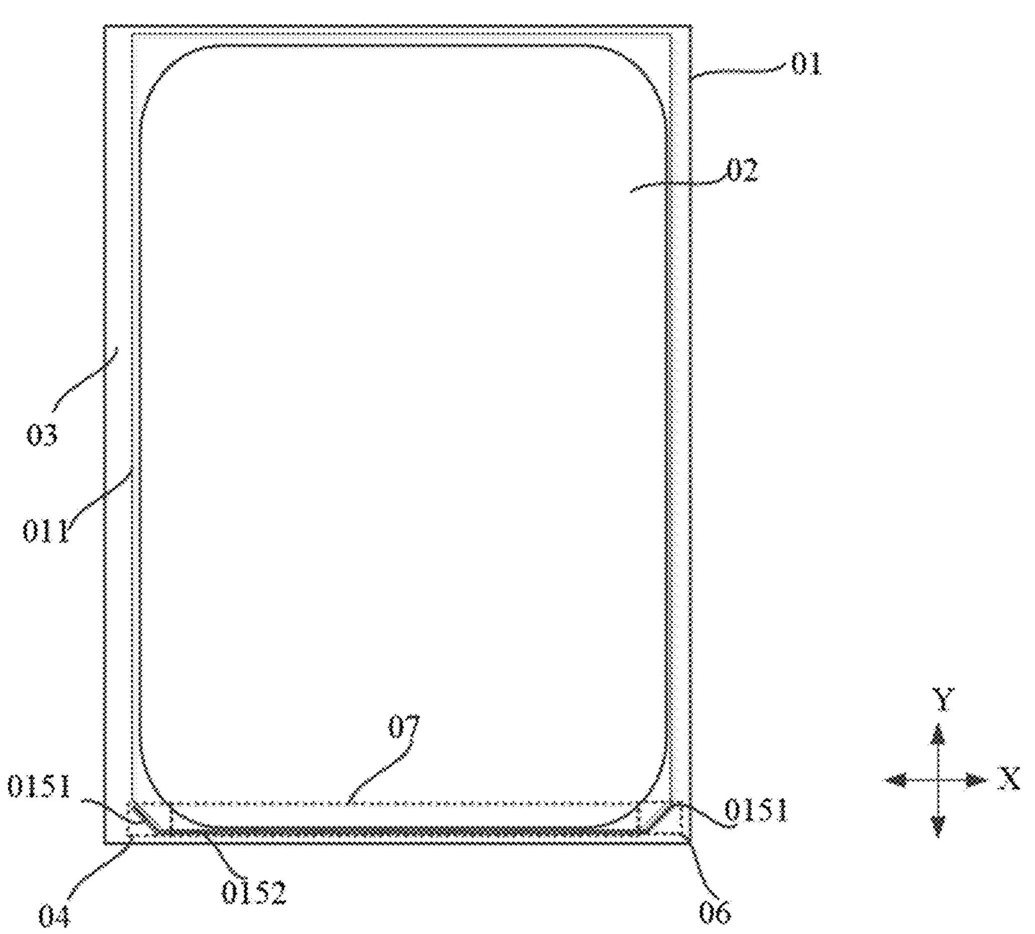
Figure 6:
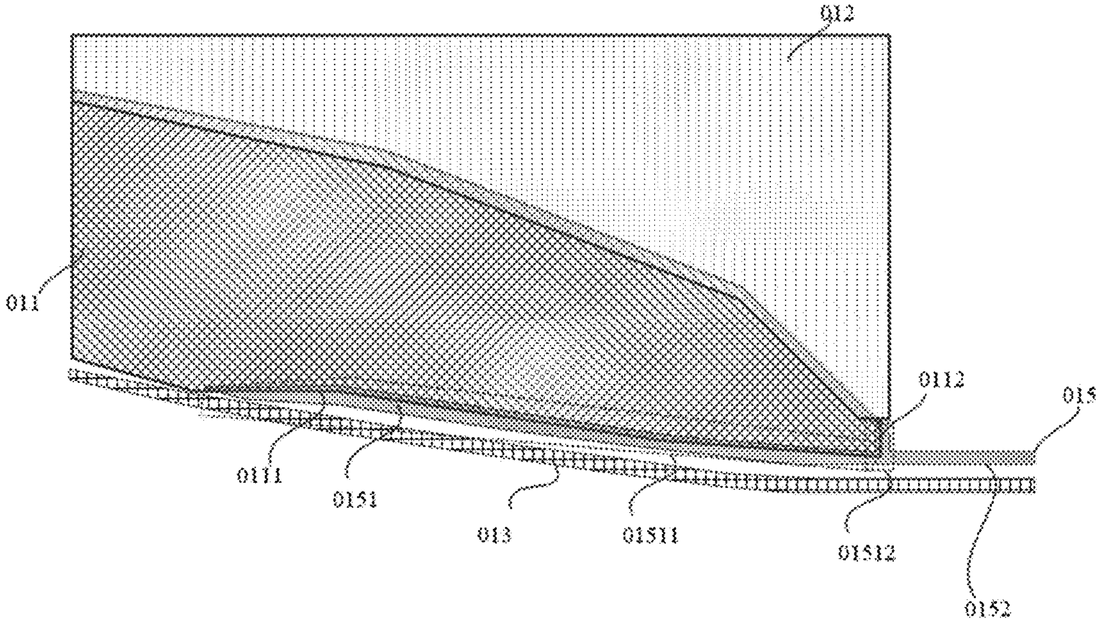
FIGS. 6 to 7 and 10 to 16 are schematic partial enlarged views showing display substrates according to embodiments of the present disclosure.

It is found that in the encapsulating reliability test, there is also a relatively high risk for the water vapor intrusion occurring at a third region 07 located between the first region 04 and the second region 06. In order to ensure the encapsulating reliability of the display substrate, as shown in FIGS. 5 and 6, the second dam portion 015 may also be provided in the third region 07, the second dam portion 015 in the third region 07 is referred to as a second dam structure 0152, and the second dam structure 0152 and the first dam structure 0151 together forms the second dam portion 015. As shown in FIG. 5, the second dam structure 0152 extends from the first region 04 via the third region 07 to the second region 06. Alternatively, the second dam structures 0152 may also be discontinuously distributed in the third region 07, without continuously extending from the first region 04 via the third region 07 to the second region 06.

In order to realize the narrow frame of the display substrate, the maximum width of the second dam portion 015 in the direction perpendicular to the extending direction of the second dam portion 015 needs to be less than the maximum width of the first dam portion 013 in the direction perpendicular to the extending direction of the first dam portion 013. A longitudinal cross section of the second dam portion 015 in the direction perpendicular to the extending direction of the second dam portion 015 may be rectangular, trapezoidal or semi-ellipsoidal, and the maximum width of the second dam portion 015 in the direction perpendicular to the extending direction of the second dam portion 015 determines an area occupied by the second dam portion 015. A longitudinal section of the first dam portion 013 in the direction perpendicular to the extending direction of the first dam portion 013 may be rectangular, trapezoidal or semi-ellipsoidal, and the maximum width of the first dam portion

013 in the direction perpendicular to the extending direction of the first dam portion 013 determines an area occupied by the first dam portion 013.

In some embodiments, the maximum width of the first dam portion 013 in the direction perpendicular to the extending direction of the first dam portion 013 may ranges from 30 micrometers to 50 micrometers, such as 30 micrometers, 35 micrometers, 40 micrometers, 45 micrometers, or 50 micrometers. The maximum width of the second dam portion 015 in the direction perpendicular to the extending direction of the second dam portion 015 may ranges from 10 micrometers to 50 micrometers, such as 10 micrometers, 15 micrometers, 20 micrometers, 25 micrometers, 30 micrometers, 35 micrometers, or 45 micrometers. Since the maximum width of the second dam portion 015 in the direction perpendicular to the extending direction of the second dam portion 015 is less than the maximum width of the first dam portion 013 in the direction perpendicular to the extending direction of the first dam portion 013, an area occupied by a combination of the second dam portion 015 and the first dam portion 013 is less than an area occupied by two rings of first dam portions 013, which is advantageous for narrowing the frame of the display substrate.

In order to further make the frame of the display substrate narrower, in some embodiments, the maximum width of the second dam portion 015 in the direction perpendicular to the extending direction of the second dam portion 015 may ranges from 15 micrometers to 30 micrometers, such as 15 micrometers, 16 micrometers, 17 micrometers, 18 micrometers, 19 micrometers, 20 micrometers, 21 micrometers, 22 micrometers, 23 micrometers, 24 micrometers, 25 micrometers, 26 micrometers, 27 micrometers, 28 micrometers, 29 micrometers or 30 micrometers.

Since the water vapor intrusion is liable to occur in the first region 04 and the second region 06, and the pixel definition layer of the display substrate, which is made of an organic insulating material, may absorb the water vapor easily, the pixel definition layer at a partial area of the first region 04 can be removed, so that an orthographic projection of the pixel definition layer onto the base substrate does not overlap with the partial area of the first region 04. The pixel definition layer at a partial area of the second region 06 can also be removed, so that the orthographic projection of the pixel definition layer onto the base substrate does not overlap with the partial area of the second region 06. Alternatively, the pixel definition layer at the partial area of the first region 04 and the pixel definition layer at the partial area of the second region 06 are both removed, so that the orthographic projection of the pixel definition layer onto the base substrate does not overlap with the partial area of the first region 04 and with the partial area of the second region 06, which can further reduce the risk of water vapor intrusion.

In some embodiments, in the first region 04 and the second region 06, the first dam structure 0151 can be formed by using the pixel definition layer, so that the pixel definition layer can be used as the first dam structure 0151 on the one hand, and can also cover the edge of the VSS 011 on the other hand, so as to prevent Ag particles remained at the edge of the VSS 011 from being flushed to the display region 02 in the subsequent cleaning process. In this embodiment, the VSS 011 may be formed using the same material as that of an anode of the display region, and through a single patterning process with the anode of the display region. Since the pixel definition layer is formed after the anode, the edge of the VSS 011 can be covered with the pixel definition layer.

In a case that the first dam structure 0151 is formed by using the pixel definition layer, the first region 04 includes a first sub-region where the first dam structure 0151 is located, and a second sub-region outside the first sub-region; the orthographic projection of the pixel definition layer onto the base substrate does not overlap with the second sub-region, namely, the pixel definition layer at other regions outside the region where the first dam structure 0151 is located is removed; and/or, the second region 06 includes a third sub-region where the first dam structure 0151 is located, and a fourth sub-region outside the third sub-region; the orthographic projection of the pixel definition layer onto the base substrate does not overlap with the fourth sub-region, namely, the pixel definition layer at other regions outside the region where the first dam structure 0151 is located is removed.

Figure 7:
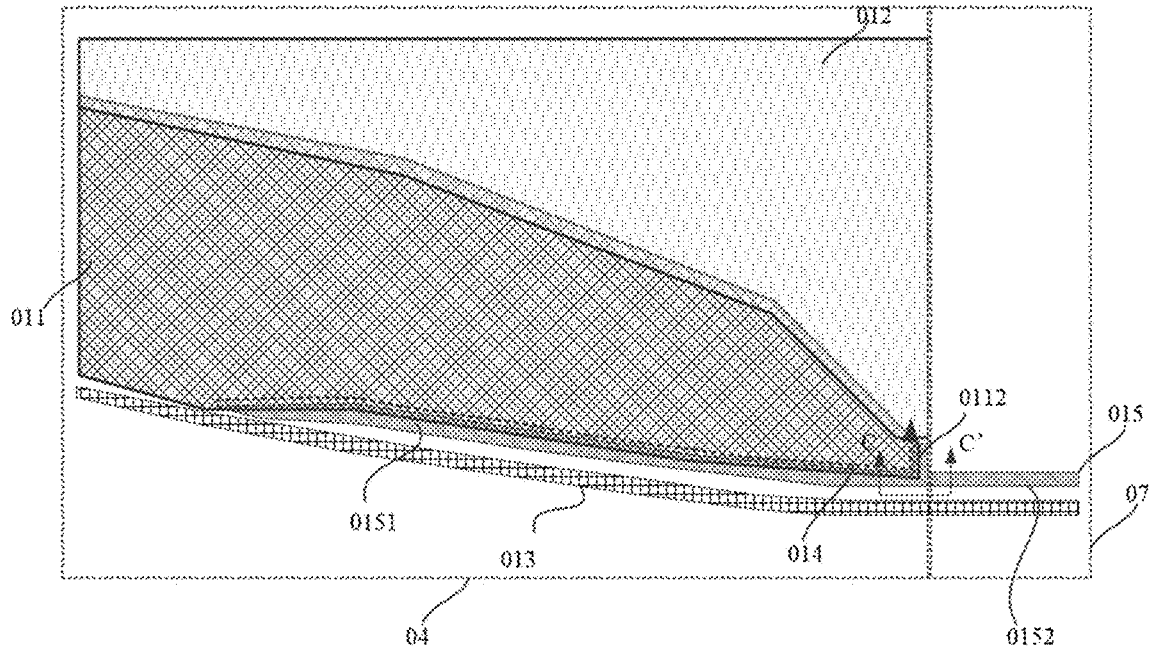

In a specific embodiment, as shown in FIGS. 6 and 7, the second dam portion 015 includes a first dam structure 0151 located at the first region 04 and a second dam structure 0152 located at the third region 07. In the first region 04, the end portion of the VSS 011 includes a first edge 0111 at a side adjacent to the first dam portion 013, and the first dam structure 0151 includes a first portion 01511 (a portion within the first dotted line box from left to right in FIG. 6). In order to prevent Ag particles at the first edge 0111 from being flushed to the display region 02 in the subsequent cleaning process, an orthographic projection of the first portion 01511 onto the base substrate covers an orthographic projection of the first edge 0111 onto the base substrate, so that the first portion 01511 can cover the first edge 0111 and prevent residual Ag particles at the first edge 0111 from being flushed to the display region 02 in the subsequent cleaning process. An extending direction of the first portion 01511 may be parallel or substantially parallel to an extending direction of the first edge 0111. The end portion of the VSS 011 includes a second edge 0112 at a side adjacent to the third region 07, and the first dam structure 0151 includes a second portion 01512 (a portion within the second dotted line box from left to right in FIG. 6). In order to prevent Ag particles at the second edge 0112 from being flushed to the display region 02 in the subsequent cleaning process, an orthographic projection of the second portion 01512 onto the base substrate covers an orthographic projection of the second edge 0112 onto the base substrate, so that the second portion 01512 can cover the second edge 0112, and prevent residual Ag particles at the second edge 0112 being flushed to the display region 02 in the subsequent cleaning process. An extending direction of the second portion 01512 may be parallel or substantially parallel to an extending direction of the second edge 0112.

As shown in FIG. 7, for the above-mentioned structure, a water vapor intrusion channel 014 (a dotted line with an arrow) may be obtained as shown in this figure. By adjusting the starting position and the ending position of the first dam structure 0151, for example, setting a length of the first dam structure 0151 to be greater than 2000 micrometers, which may specifically be 2100 micrometers, 2200 micrometers, 2300 micrometers, 2400 micrometers, 2500 micrometers, 2600 micrometers or 2700 micrometers, a length of the water vapor intrusion channel 014 is greater than 2000 micrometers. In this way, the path for the water vapor intrusion is greatly extended, the risk of water vapor intrusion during the REL process can be reduced, and the encapsulating reliability of the display substrate can be ensured.

In order to further ensure the encapsulating reliability of the display substrate, as shown in FIGS. 6 and 7, the second dam structure 0152 may also be provided in the third region 07, and an extending direction of the second dam structure 0152 may be parallel or substantially parallel to an extending direction of the first dam portion 013 at the third region 07.

Figure 8:
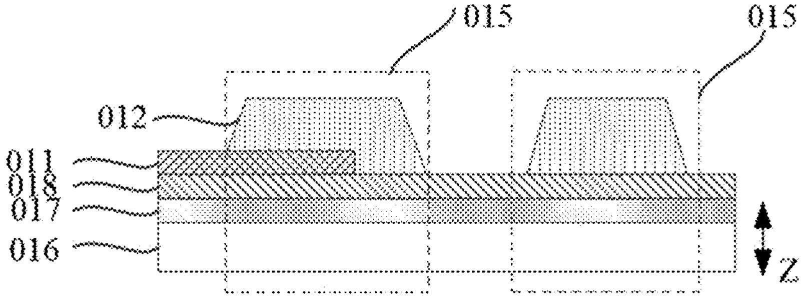
FIGS. 8 and 9 are schematic cross-sectional views taken along a direction CC' of FIG. 7.
Figure 9:
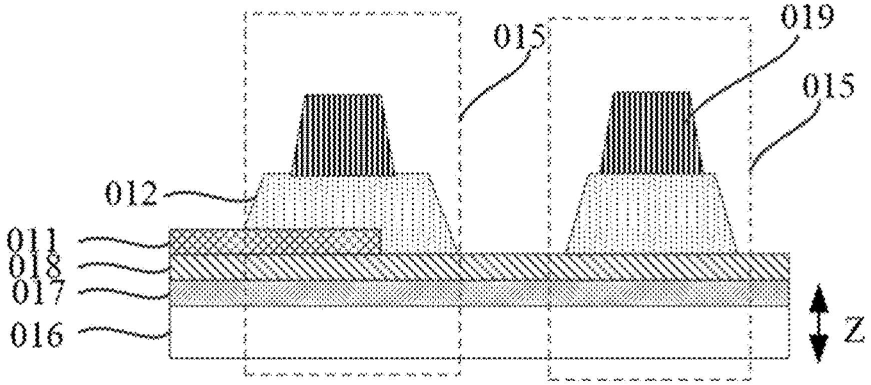

FIGS. 8 and 9 are schematic cross-sectional views taken along the CC' direction in FIG. 7. As shown in FIGS. 8 and 9, the display substrate includes a base substrate 016, a first planarization layer 017, a second planarization layer 018, a pixel definition layer 012 and a spacer 019 which are located at the frame region and are stacked in the sequence listed.

As shown in FIG. 8, in a Z direction, the second dam portion 015 may be formed by the first planarization layer 017, the second planarization layer 018, and the pixel definition layer 012.

Alternatively, as shown in FIG. 9, in the Z direction, the second dam portion 015 may be formed by the first planarization layer 017, the second planarization layer 018, the pixel definition layer 012, and the spacer 019.

Alternatively, the second dam portion 015 may also be formed by the first planarization layer 017, the pixel definition layer 012, and the spacer 019; or the second dam portion 015 may be formed by the second planarization layer 018, the pixel definition layer 012, and the spacer 019.

That is, the second dam portion 015 may be formed by at least one of the first planarization layer 017, the second planarization layer 018, the pixel definition layer 012, and the spacer 019. In the first region 04 and the second region 06, due to the presence of the VSS 011, in order to prevent the Ag particles remaining at the edge of the VSS 011 from being flushed to the display region 02 in the subsequent cleaning process, the first dam structure 0151 may be formed at least by the pixel definition layer 012, so that the pixel definition layer 012 can not only form the first dam structure 0151, but also cover the edge of the VSS 011 to prevent the Ag particles remaining at the edge of the VSS 011 from being flushed to the display region 02 in the subsequent cleaning process. The second dam structure 0152 at the third region 07 may not include the pixel definition layer 012 or may include the pixel definition layer 012.

In addition, in order to ensure the flatness of the display substrate, the first dam structure 0151 and the second dam structure 0152 may have the same film structure, and the thickness of the film structure may be the same or approximately the same. For example, the first dam structure 0151 is formed by the first planarization layer 017, the second planarization layer 018 and the pixel definition layer 012, then the second dam structure 0152 is also formed by the first planarization layer 017, the second planarization layer 018 and the pixel definition layer 012. The thickness of the first planarization layer 017 for forming the first dam structure 0151 is the same or approximately the same as the thickness of the first planarization layer 017 for forming the second dam structure 0152. The thickness of the second planarization layer 018 for forming the first dam structure 0151 is the same or approximately the same as the thickness of the second planarization layer 018 for forming the second dam structure 0152. The thickness of the pixel definition layer 012 for forming the first dam structure 0151 is the same or approximately the same as the thickness of the pixel definition layer 012 for forming the second dam structure 0152. For another example, the first dam structure 0151 is formed by the first planarization layer 017, the second planarization layer 018, the pixel definition layer 012 and the spacer 019, then the second dam structure 0152 is also formed by the first planarization layer 017, the second planarization layer 018, the pixel definition layer 012 and the spacer 019. The thickness of the first planarization layer 017 for forming the first dam structure 0151 is the same or approximately the same as the thickness of the first planarization layer 017 for forming the second dam structure 0152. The thickness of the second planarization layer 018 for forming the first dam structure 0151 is the same or approximately the same as the thickness of the second planarization layer 018 for forming the second dam structure 0152. The thickness of the pixel definition layer 012 for forming the first dam structure 0151 is the same or approximately the same as the thickness of the pixel definition layer 012 for forming the second dam structure 0152. The thickness of the spacer 019 for forming the first dam structure 0151 is the same or approximately the same as the thickness of the spacer 019 for forming the second dam structure 0152.

Figure 10:
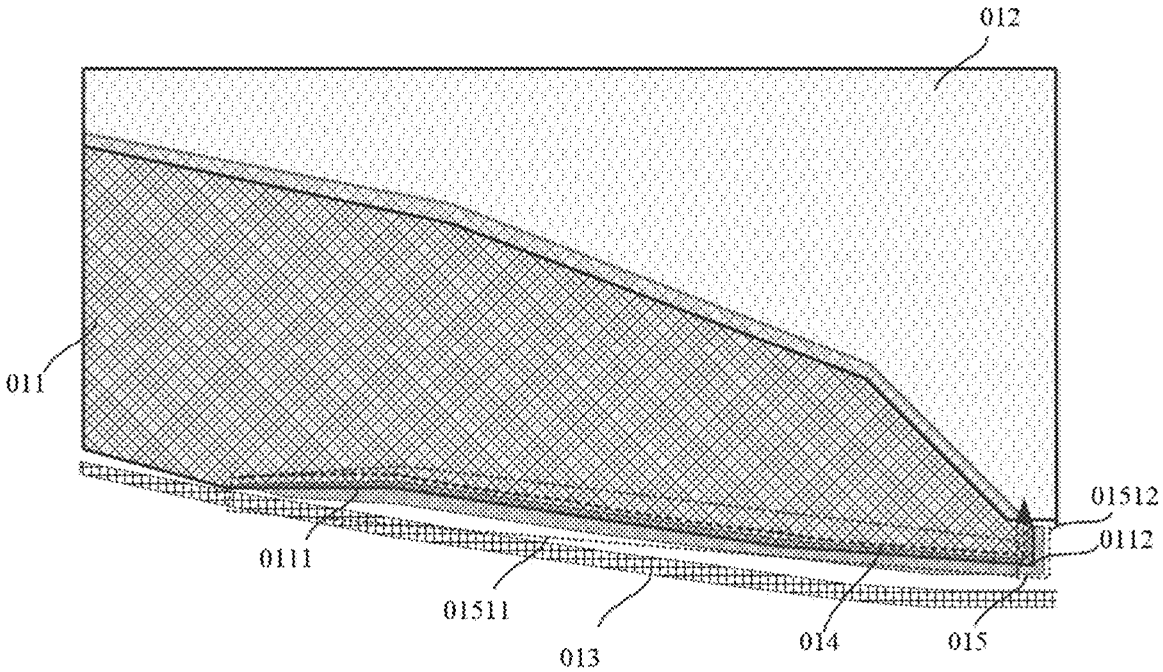

In another embodiment, as shown in FIG. 10, the second dam portion 015 includes the first dam structure 0151 located at the first region 04. In the first region 04, the end portion of the VSS 011 includes a first edge 0111 at a side adjacent to the first dam portion 013, and the first dam structure 0151 includes a first portion 01511 (a portion within the first dotted line box from left to right in the figure). In order to prevent Ag particles at the first edge 0111 from being flushed into the display region 02 in the subsequent cleaning process, an orthographic projection of the first portion 01511 onto the base substrate covers an orthographic projection of the first edge 0111 onto the base substrate, so that the first portion 01511 can cover the first edge 0111 and prevent Ag particles remaining at the first edge 0111 from being flushed into the display region 02 in the subsequent cleaning process. An extending direction of the first portion 01511 may be parallel or substantially parallel to an extending direction of the first edge 0111. The end portion of the VSS 011 includes a second edge 0112 at a side adjacent to the third region 07, the first dam structure 0151 includes a second portion 01512 (a portion within the second dotted line box from left to right in the figure). In order to prevent Ag particles at the second edge 0112 from being flushed to the display region 02 in the subsequent cleaning process, an orthographic projection of the second portion 01512 onto the base substrate covers an orthographic projection of the second edge 0112 onto the base substrate, so that the second portion 01512 can cover the second edge 0112, and prevent Ag particles remaining at the second edge 0112 from being flushed to the display region 02 in the subsequent cleaning process. An extending direction of the second portion 01512 may be parallel or substantially parallel to an extending direction of the second edge 0112.

As shown in FIG. 10, for the above-mentioned structure, a water vapor intrusion channel 014 (a dotted line with an arrow) may be obtained as shown in this figure. By adjusting the starting position and ending position of the first dam structure 0151, for example, setting a length of the first dam structure 0151 to be greater than 2000 micrometers, which specifically may be 2100 micrometers, 2200 micrometers, 2300 micrometers, 2400 micrometers, 2500 micrometers, 2600 micrometers or 2700 micrometers, the length of the water vapor intrusion channel 014 is greater than 2000 micrometers. In this way, the path of the water vapor intrusion is greatly extended, the risk of the water vapor intrusion during the REL process can be reduced, and the encapsulating reliability of the display substrate can be ensured.

In this embodiment, the second dam structure 0152 is not provided in the third region 07, so that there is no need to keep the pixel definition layer 012 in the third region 07 to form the second dam structure 0152, which can reduce the risk of the water vapor intrusion in the third region 07. In addition, this is advantageous to reduce the frame width at the third region 07.

In the present embodiment, the structure of the first dam structure 0151 may be referred to the structures shown in FIGS. 8 and 9, and the description of which is omitted here.

Figure 11:
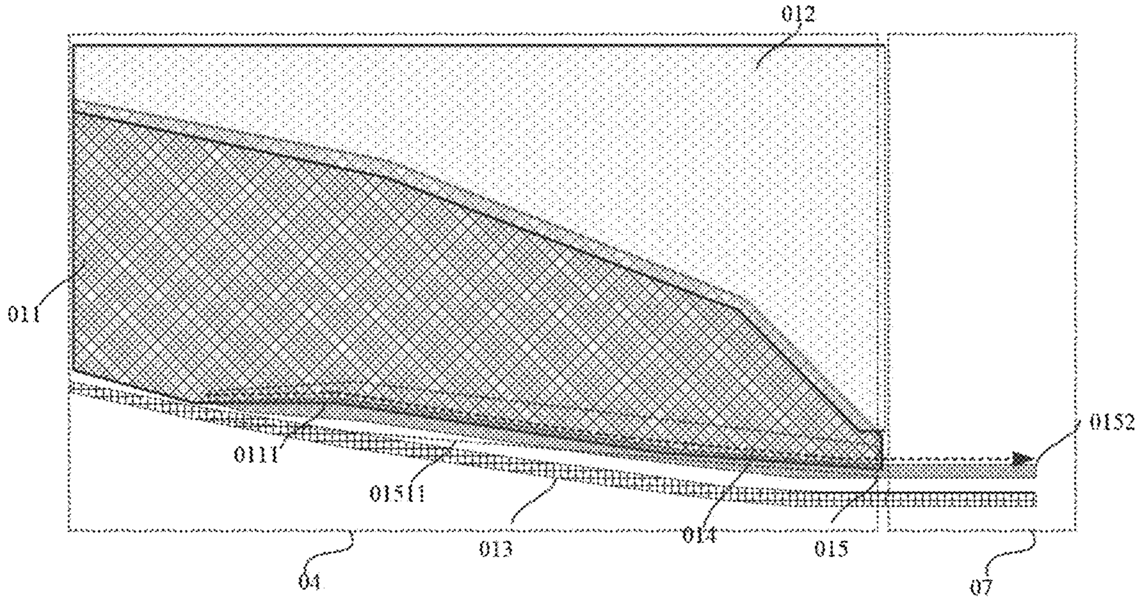

In yet another embodiment, as shown in FIG. 11, the second dam portion 015 includes the first dam structure 0151 located at the first region 04. In the first region 04, the end portion of the VSS 011 includes a first edge 0111 at a side adjacent to the first dam portion 013, and the first dam structure 0151 includes a first portion 01511 (a portion within a dotted line box in the figure). In order to prevent Ag particles at the first edge 0111 from being flushed to the display region 02 in the subsequent cleaning process, an orthographic projection of the first portion 01511 onto the base substrate covers an orthographic projection of the first edge 0111 onto the base substrate, so that the first portion 01511 can cover the first edge 0111 and prevent Ag particles remaining at the first edge 0111 from being flushed to the display region 02 in the subsequent cleaning process. An extending direction of the first portion 01511 may be parallel or substantially parallel to an extending direction of the first edge 0111.

In order to further ensure the encapsulating reliability of the display substrate, as shown in FIG. 11, the second dam structure 0152 may also be provided in the third region 07, and an extending direction of the second dam structure 0152 may be parallel or substantially parallel to an extending direction of the first dam portion 013 at the third region 07.

As shown in FIG. 11, for the above-mentioned structure, a water vapor intrusion channel 014 (a dotted line with an arrow) may be obtained as shown in this figure. The length of the water vapor intrusion channel 014 is approximately equal to a sum of the length of the first dam structure 0151 and the length of the second dam structure 0152. By adjusting the starting position and the ending position of the first dam structure 0151 and those of the second dam structure 0152, the length of the water vapor intrusion channel 014 may be greater than 2000 micrometers. In this way, the path of the water vapor intrusion is greatly extended, the risk of the water vapor intrusion during the REL process can be reduced, and the encapsulating reliability of the display substrate can be ensured.

In the present embodiment, the structures of the first dam structure 0151 and the second dam structure 0152 may be referred to the structures shown in FIGS. 8 and 9, and the description of which is omitted here.

Figure 12:
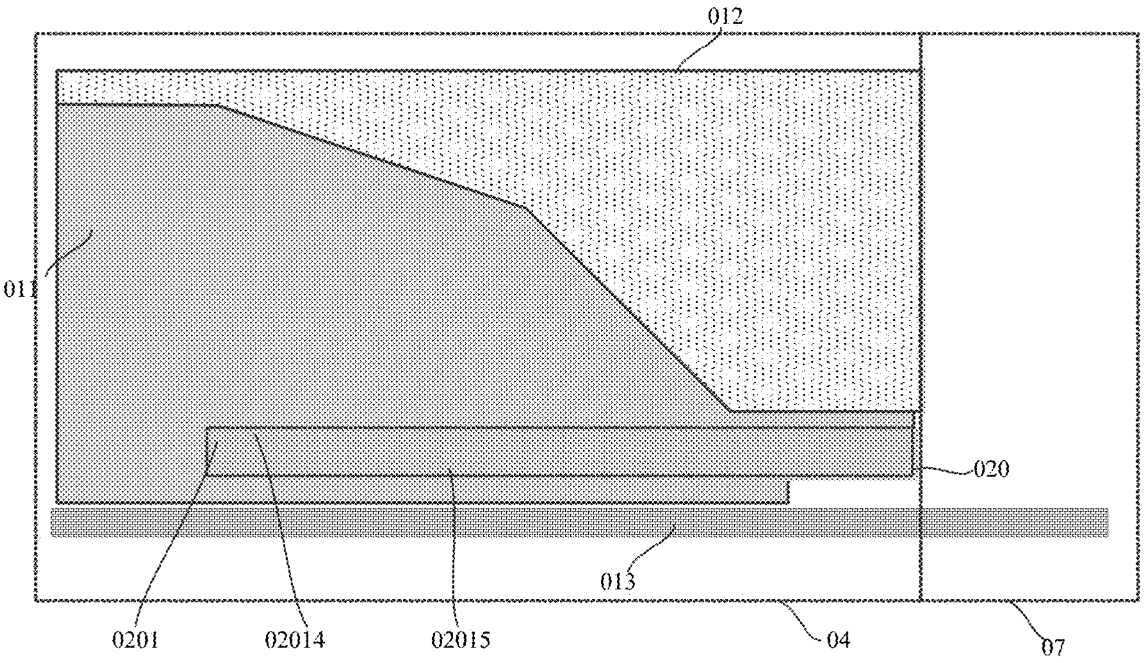

In some embodiments, as shown in FIG. 12, the end portion of the VSS 011 is provided with a gap portion 020 (a portion within a smallest dotted line box in the figure) at a side adjacent to the third region 07, and an edge of the gap portion 020 is a third edge 0201. In some embodiments, the gap portion 020 may be rectangular, as shown in FIG. 12, the gap portion 020 has a width D and a length L. The gap portion 020 is not limited to be rectangular, but may be circular, oval, diamond, trapezoidal, square, or other shapes as desired for displaying.

In the present embodiment, an example in which the gap portion 020 is a rectangle is taken for illustration.

Figure 13:
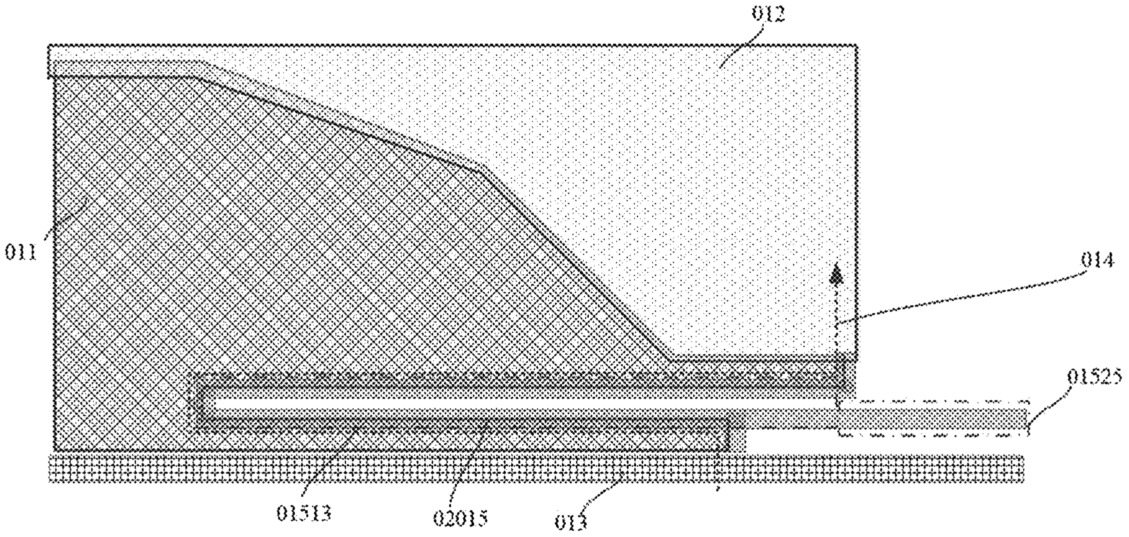

In a specific embodiment, as shown in FIGS. 12 and 13, the first dam structure 0151 includes a third portion 01513 (a portion within the first dotted line box from left to right in FIG. 13). In order to prevent the Ag particles remaining at the third edge 0201 from being flushed to the display region 02 in the subsequent cleaning process, an orthographic projection of the third portion 01513 onto the base substrate covers an orthographic projection of the third edge 0201 of the gap portion onto the base substrate, so that the third portion 01513 can cover the third edge 0201 and prevent the Ag particles remaining at the third edge 0201 from being flushed to the display region 02 in the subsequent cleaning process. An extending direction of the third portion 01513 may be parallel or substantially parallel to an extending direction of the third edge 0201.

As shown in FIG. 13, the gap portion 020 includes a fifth edge 02015 parallel or substantially parallel to the first dam portion 013, the fifth edge 02015 is a part of the third edge 0201, the second dam structure 0152 includes a fifth portion 01525 (a portion within the second dotted line box from left to right in FIG. 13) extending in an extending direction of the fifth edge 02015, and the fifth portion 01525 can block the overflowing of the ink during the encapsulation process of the display substrate, thereby ensuring the encapsulation reliability of the display substrate.

As shown in FIG. 13, for the above-mentioned structure, a water vapor intrusion channel 014 (a dotted line with an arrow) may be obtained as shown in the figure. By adjusting the size of the gap portion 020, a length of the water vapor intrusion channel 014 can be greater than 2000 micrometers. In this way, the path of the water vapor intrusion can be greatly extended, the risk of the water vapor intrusion during the REL process can be reduced, and the encapsulating reliability of the display substrate can be ensured.

In some embodiments, a width D of the gap portion may range from 10 micrometers to 60 micrometers, a length L of the gap portion may range from 200 micrometers to 5000 micrometers. Specifically, the width D of the gap portion may be 10 micrometers, 15 micrometers, 20 micrometers, 25 micrometers, 30 micrometers, 35 micrometers, 40 micrometers, 45 micrometers, 50 micrometers, 55 micrometers, or 60 micrometers. The length L of the gap portion may be 200 micrometers, 500 micrometers, 1000 micrometers, 2000 micrometers, 3000 micrometers, 4000 micrometers, 4500 micrometers, or 5000 micrometers.

In this embodiment, the structures of the third portion 01513 and the fifth portion 01525 may refer to the structures shown in FIGS. 8 and 9, which will not be described in detail herein.

Figure 14:
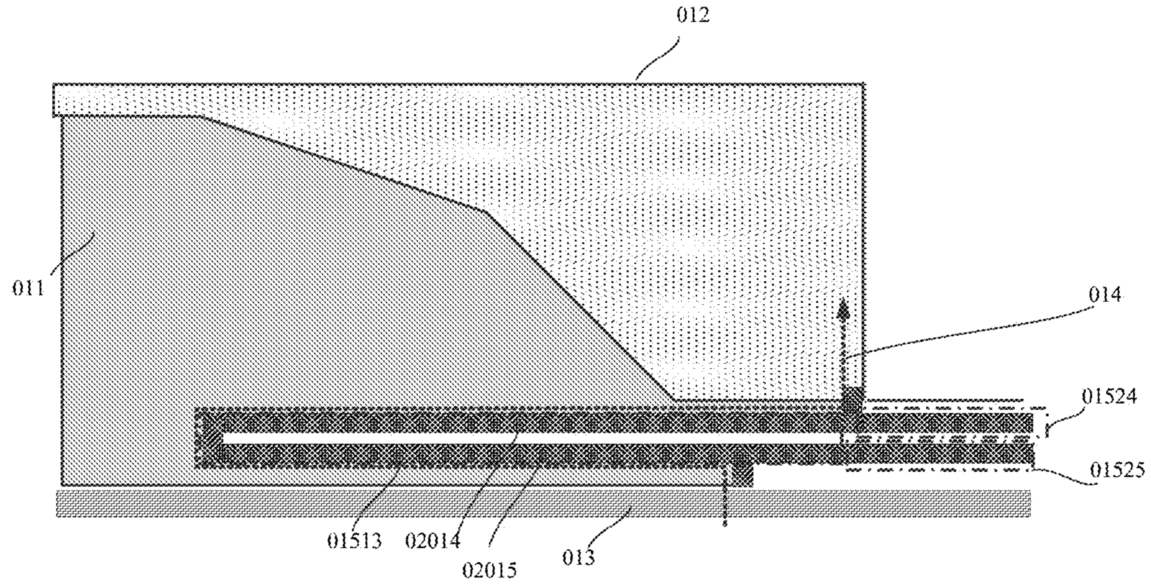

In another specific embodiment, as shown in FIGS. 12 and 14, the first dam structure 0151 includes a third portion 01513 (a portion within the first dotted line box from left to right in FIG. 14). In order to prevent the Ag particles remaining at the third edge 0201 from being flushed to the display region 02 in the subsequent cleaning process, an orthographic projection of the third portion 01513 onto the base substrate covers the orthographic projection of the third edge 0201 of the gap portion onto the base substrate, so that the third portion 01513 can cover the third edge 0201 and prevent the Ag particles remaining at the third edge 0201 from being flushed to the display region 02 in the subsequent cleaning process. An extending direction of the third portion 01513 may be parallel or substantially parallel to the extending direction of the third edge 0201.

As shown in FIG. 14, the gap portion 020 includes a fifth edge 02015 and a fourth edge 02014 which are parallel or substantially parallel to the first dam portion 013, both the fifth edge 02015 and the fourth edge 02014 are part of the third edge 0201. The second dam structure 0152 includes a fifth portion 01525 (a portion within a dotted line box at the lower right in FIG. 14) extending in an extending direction of the fifth edge 02015 and a fourth portion 01524 (a portion within a dotted line box at the upper right in FIG. 14) extending in an extending direction of the fourth edge 02014. The fifth portion 01525 and the fourth portion 01524 can effectively block the overflowing of the ink during the encapsulating process of the display substrate, thereby ensuring the encapsulating reliability of the display substrate.

As shown in FIG. 14, for the above-mentioned structure, a water vapor intrusion channel 014 (a dotted line with an arrow) may be obtained as shown in the figure. By adjusting the size of the gap portion 020, a length of the water vapor intrusion channel 014 can be greater than 2000 micrometers. In this way, the path of the water vapor intrusion can be greatly extended, the risk of the water vapor intrusion during the REL process can be reduced and the encapsulating reliability of the display substrate can be ensured.

In some embodiments, a width D of the gap portion may range from 10 micrometers to 60 micrometers, and a length L of the gap portion may range from 200 micrometers to 5000 micrometers. Specifically, the width D of the gap portion may be 10 micrometers, 15 micrometers, 20 micrometers, 25 micrometers, 30 micrometers, 35 micrometers, 40 micrometers, 45 micrometers, 50 micrometers, 55 micrometers, or 60 micrometers. The length L of the gap portion may be 200 micrometers, 500 micrometers, 1000 micrometers, 2000 micrometers, 3000 micrometers, 4000 micrometers, 4500 micrometers, or 5000 micrometers.

In this embodiment, the structures of the third portion 01513, the fifth portion 01525, and the fourth portion 01524 may refer to the structures shown in FIGS. 8 and 9, and the description thereof is omitted herein.

Figure 15:
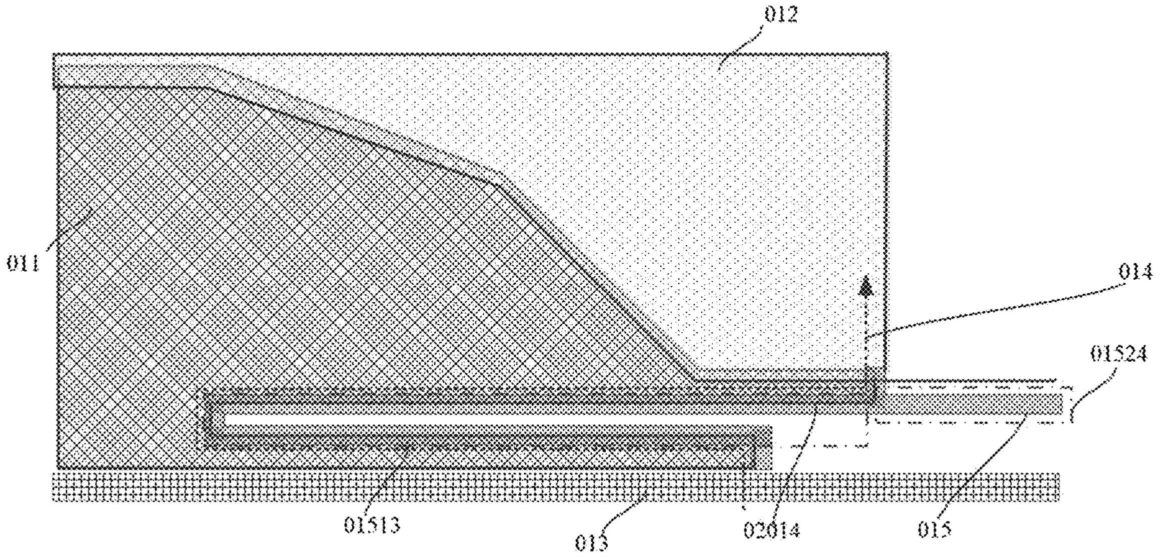

In yet another specific embodiment, as shown in FIGS. 12 and 15, the first dam structure 0151 includes a third portion 01513 (a portion within the first dotted line box from left to right in FIG. 15). In order to prevent Ag particles at the third edge 0201 from being flushed to the display region 02 in the subsequent cleaning process, an orthographic projection of the third portion 01513 onto the base substrate covers the orthographic projection of the third edge 0201 of the gap portion onto the base substrate, so that the third portion 01513 can cover the third edge 0201 and prevent residual Ag particles at the third edge 0201 from being flushed to the display region 02 in the subsequent cleaning process. An extending direction of the third portion 01513 may be parallel or substantially parallel to the extending direction of the third edge 0201.

As shown in FIG. 15, the gap portion 020 includes a fourth edge 02014 parallel or substantially parallel to the first dam portion 013, the fourth edge 02014 is a part of the third edge 0201. The second dam structure 0152 includes a fourth portion 01524 (a portion within the second dotted line box from left to right in FIG. 15) extending in an extending direction of the fourth edge 02014, and the fourth portion 01524 can block the overflowing of the ink during the encapsulating process of the display substrate, thereby ensuring the encapsulating reliability of the display substrate.

As shown in FIG. 15, for the above-mentioned structure, a water vapor intrusion channel 014 (a dotted line with an arrow) may be obtained as shown in the figure. By adjusting the size of the gap portion 020, a length of the water vapor intrusion channel 014 can be greater than 2000 micrometers. In this way, the path of the water vapor intrusion can be greatly extended, the risk of the water vapor intrusion during the REL process can be reduced and the encapsulating reliability of the display substrate can be ensured.

In some embodiments, a width D of the gap portion may range from 10 micrometers to 60 micrometers and a length L of the gap portion may range from 200 micrometers to 5000 micrometers. Specifically, the width D of the gap portion may be 10 micrometers, 15 micrometers, 20 micrometers, 25 micrometers, 30 micrometers, 35 micrometers, 40 micrometers, 45 micrometers, 50 micrometers, 55 micrometers, or 60 micrometers. The length L of the gap portion may be 200 micrometers, 500 micrometers, 1000 micrometers, 2000 micrometers, 3000 micrometers, 4000 micrometers, 4500 micrometers, or 5000 micrometers.

In this embodiment, the structures of the third portion 01513 and the fourth portion 01524 may refer to the structures shown in FIGS. 8 and 9, and the description thereof is omitted herein.

Figure 16:
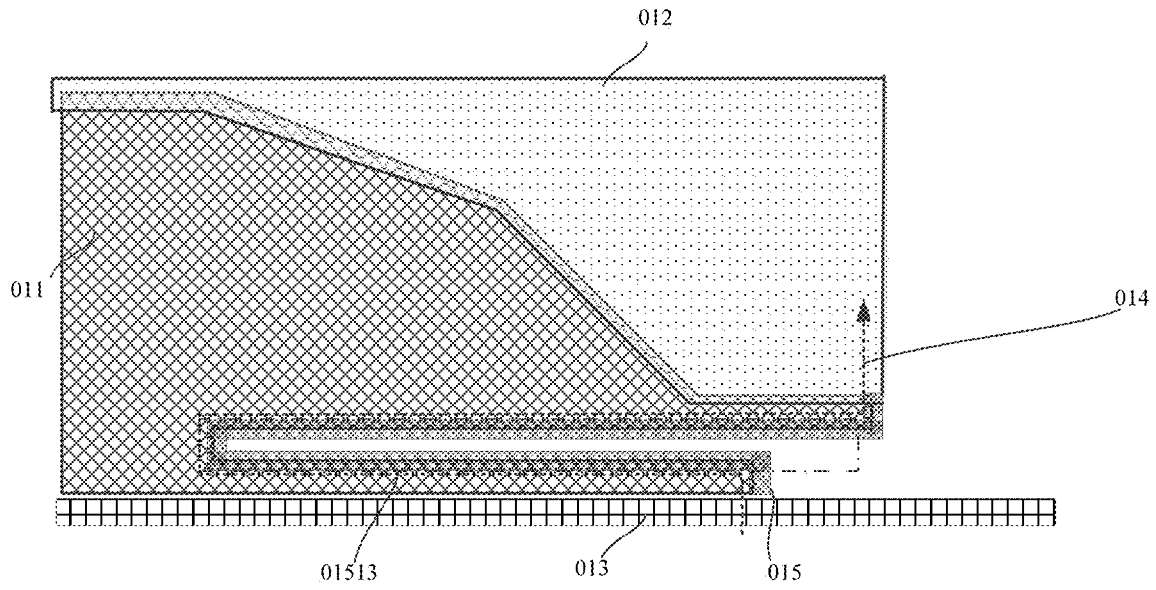

In still yet another specific embodiment, as shown in FIGS. 12 and 16, the first dam structure 0151 includes a third portion 01513 (a portion within a dotted frame in FIG. 16). In order to prevent the Ag particles remaining at the third edge 0201 from being flushed to the display region 02 in the subsequent cleaning process, an orthographic projection of the third portion 01513 onto the base substrate covers the orthographic projection of the third edge 0201 of the gap portion onto the base substrate, so that the third portion 01513 can cover the third edge 0201 and prevent the Ag particles remaining at the third edge 0201 from being flushed to the display region 02 in the subsequent cleaning process. An extending direction of the third portion 01513 may be parallel or substantially parallel to the extending direction of the third edge 0201.

As shown in FIG. 16, for the above-mentioned structure, a water vapor intrusion channel 014 (a dotted line with an arrow) may be obtained as shown in the figure. By adjusting the size of the gap portion 020, a length of the water vapor intrusion channel 014 can be greater than 2000 micrometers. In this way, the path of the water vapor intrusion can be greatly extended, the risk of the water vapor intrusion during the REL process can be reduced and the encapsulating reliability of the display substrate can be ensured.

In some embodiments, a width D of the gap portion may range from 10 micrometers to 60 micrometers, and a length L of the gap portion may range from 200 micrometers to 5000 micrometers. Specifically, the width D of the gap portion may be 10 micrometers, 15 micrometers, 20 micrometers, 25 micrometers, 30 micrometers, 35 micrometers, 40 micrometers, 45 micrometers, 50 micrometers, 55 micrometers, or 60 micrometers. The length L of the gap portion may be 200 micrometers, 500 micrometers, 1000 micrometers, 2000 micrometers, 3000 micrometers, 4000 micrometers, 4500 micrometers, or 5000 micrometers.

In this embodiment, the second dam structure 0152 is not provided in the third region 07, so that there is no need to keep the pixel definition layer 012 in the third region 07 to form the second dam structure 0152, so that the risk of the water vapor intrusion in the third region 07 can be reduced. In addition, this is advantageous to reduce the frame width at the third region 07.

In this embodiment, the structure of the third portion 01513 may refer to the structures shown in FIGS. 8 and 9, and the description thereof is omitted herein.

In the present embodiment, a height of the second dam portion 015 in the direction perpendicular to the base substrate may be less than or equal to a height of the first dam portion 013 in the direction perpendicular to the base substrate, so that the first dam portion 013 and the second dam portion 015 may form a stepped structure. In this way, the overflow of the ink can be effectively blocked when encapsulating the display substrate, ensuring that the ink does not go beyond the first dam portion during the IJP process, and improving the encapsulation reliability of the display substrate.

In view of the above, with the display substrate provided in the embodiments of the present disclosure, with the provision of the second dam portion 015, it is possible to improve the capability of blocking the ink overflowing from the display region of the display substrate on the basis of narrowing the frame size of the display substrate, thereby improving the manufacturing yield of the IJP.

Embodiments of the present disclosure further provide a display substrate, as shown in FIG. 4, the display substrate includes:

- a base substrate, where the base substrate includes a display region 02 and a frame region 03 surrounding the display region 02;
- a first dam portion, located at the frame region 03 and surrounding the display region 02;
- where the frame region 03 is provided with a low-voltage signal line 011, the frame region 03 includes a first region 04 and a second region 06, an end portion of the low-voltage signal line 011 is located at the first region 04 and the second region 06, the first region 04 and the second region 06 are symmetrical with respect to the display region 02, the frame region 03 further includes a third region 07 located between the first region 04 and the second region 06, and the low-voltage signal line 011 is not arranged at the third region 07; and
- a second dam portion, located at least at the first region 04, the second region 06 and/or the third region 07, where the second dam portion is located at a side of the first dam portion adjacent to the display region.

As shown in FIG. 4, the frame region 03 is provided with a low-voltage signal line VSS 011. In an encapsulating reliability test, it is found that there may be a relatively high risk for water vapor intrusion occurring at the region (the first region 04 and the second region 06) where the end portion of the VSS 011 is located, and there may also be a relatively high risk for water vapor intrusion occurring at the third region 07 located between the first region 04 and the second region 06. In order to ensure the encapsulating reliability of the display substrate, the second dam portion may be provided in the first region, or the second dam portion may be provided in the second region, or the second dam portion may be provided in the first region and the second region, or the second dam portion may be provided in the first region, the second region, and the third region.

In order to realize a narrow frame of the display substrate, a maximum width of the second dam portion in a direction perpendicular to an extending direction of the second dam portion should be less than a maximum width of the first dam portion in a direction perpendicular to an extending direction of the first dam portion, a longitudinal cross section of the second dam portion in the direction perpendicular to the extending direction of the second dam portion may be rectangular, trapezoidal or semi-ellipsoidal, and an area occupied by the second dam portion is determined by the maximum width of the second dam portion in the direction perpendicular to the direction perpendicular the an extending direction of the second dam portion. A longitudinal section of the first dam portion in a direction perpendicular to its own extension may be rectangular, trapezoidal or semi-ellipsoidal, and an area occupied by the first dam portion is determined by the maximum width of the first dam portion in the direction perpendicular to the extending direction of the first dam portion.

In some embodiments, the maximum width of the first dam portion in the direction perpendicular to the extending direction of the first dam portion may be between 30 micrometers and 50 micrometers, such as 30 micrometers, 35 micrometers, 40 micrometers, 45 micrometers or 50 micrometers. The maximum width of the second dam portion in the direction perpendicular to the extending direction of the second dam portion may be between 10 micrometers and 50 micrometers, such as 10 micrometers, 15 micrometers, 20 micrometers, 25 micrometers, 30 micrometers, 35 micrometers or 45 micrometers. Since the maximum width of the second dam portion in the direction perpendicular to the extending direction of the second dam portion is less than the maximum width of the first dam portion in the direction perpendicular to the extending direction of the first dam portion, an area occupied by a combination of the second dam portion and the first dam portion is less than an area occupied by two rings of the first dam portions, which is advantageous for reducing the frame width of the display substrate.

In order to further reduce the frame width of the display substrate, in some embodiments, the maximum width of the second dam portion in the direction perpendicular to the extending direction of the second dam portion may be between 15 micrometers and 30 micrometers, such as 15 micrometers, 16 micrometers, 17 micrometers, 18 micrometers, 19 micrometers, 20 micrometers, 21 micrometers, 22 micrometers, 23 micrometers, 24 micrometers, 25 micrometers, 26 micrometers, 27 micrometers, 28 micrometers, 29 micrometers or 30 micrometers.

In some embodiments, a length of the second dam portion in the extending direction of the second dam portion is less than a length of the first dam portion in the extending direction of the first dam portion. This is because there is a relatively low risk for water vapor intrusion occurring at other regions of the frame region other than the first region, the second region and the third region, and as a result, the second dam portion may not be provided in the other regions, and only the first dam portion should be provided in the other regions, which is advantageous for realizing the narrow frame of the display substrate.

An embodiment of the present disclosure further provides a display device, including the display substrate as described above.

The display device includes, but is not limited to: a radio frequency unit, a network module, an audio output unit, an input unit, a sensor, a display unit, a user input unit, an interface unit, a memory, a processor, a power supply and the like. It will be appreciated by those skilled in the art that the configuration of the display device as described above is not intended to be limiting and that the display device may include more or fewer of the components as described above, or some combinations of the components, or different arrangements of the components. In embodiments of the present disclosure, the display device includes, but is not limited to, a display, a cell phone, a tablet, a television, a wearable electronic device, a navigation display device, and the like.

The display device may be any product or component with a display function, such as a liquid crystal television, a liquid crystal display, a digital photo frame, a mobile phone, a tablet computer. The display device further includes a flexible circuit board, a printed circuit board and a back panel.

Accordingly, an embodiment of the present disclosure further provides a method for manufacturing a display substrate as shown in FIG. 8. The method includes following steps.

Step 1: providing a base substrate 016.

Step 2: forming a pattern of a first planarization layer 017 on the base substrate 016.

Step 3: forming a pattern of a second planarization layer 018 on the first planarization layer 017.

Step 4: forming a pattern of a pixel definition layer 012 on the second planarization layer 018.

The pattern of the first planarization layer 017 may be located at the first region 04, the second region 06 and/or the third region 07. The pattern of the second planarization layer 018 may be located at the first region 04, the second region 06 and/or the third region 07. The pattern of the pixel definition layer 012 may be located at the first region 04, the second region 06 and/or the third region 07.

In a case that the pattern of the first planarization layer 017 is located at the first region 04 and/or the second region 06, the pattern of the first planarization layer 017 may form a part of the first dam structure 0151 as shown in FIGS. 6-7, 10-11, and 13-16. In a case that the pattern of the first planarization layer 017 is located at the third region 07, the pattern of the first planarization layer 017 may form a part of the second dam structure 0152 as shown in FIGS. 6-7, 11, and 13-15.

In a case that the pattern of the second planarization layer 018 is located at the first region 04 and/or the second region 06, the pattern of the second planarization layer 018 may form a part of the first dam structure 0151 as shown in FIGS. 6-7, 10-11, and 13-16. In a case that the pattern of the second planarization layer 018 is located at the third region 07, the pattern of the second planarization layer 018 may form a part of the second dam structure 0152 as shown in FIGS. 6-7, 11, and 13-15.

In a case that the pattern of the pixel definition layer 012 is located at the first region 04 and/or the second region 06, the pattern of the pixel definition layer 012 may form a part of the first dam structure 0151 as shown in FIGS. 6-7, 10-11, and 13-16. In a case that the pattern of the pixel definition layer 012 is located at the third region 07, the pattern of the pixel definition layer 012 may form a part of the second dam structure 0152 as shown in FIGS. 6-7, 11, and 13-15.

Embodiments of the present disclosure further provides a method for manufacturing the display substrate as shown in FIG. 9. The method includes the following steps.

Step 1: providing a base substrate 016.

Step 2: forming a pattern of a first planarization layer 017 on the base substrate 016.

Step 3: forming a pattern of a second planarization layer 018 on the first planarization layer 017.

Step 4: forming a pattern of a pixel definition layer 012 on the second planarization layer 018.

Step 5: forming a pattern of a spacer 019 on the pixel definition layer 012.

The pattern of the first planarization layer 017 may be located at the first region 04, the second region 06 and/or the third region 07. The pattern of the second planarization layer 018 may be located at the first region 04, the second region 06 and/or the third region 07. The pattern of the pixel definition layer 012 may be located at the first region 04, the second region 06 and/or the third region 07. The pattern of the spacer 019 may be located at first region 04, second region 06, and/or third region 07.

In a case that the pattern of the first planarization layer 017 is located at the first region 04 and/or the second region 06, the pattern of the first planarization layer 017 may form a part of the first dam structure 0151 as shown in FIGS. 6-7, 10-11, and 13-16. In a case that the pattern of the first planarization layer 017 is located at the third region 07, the pattern of the first planarization layer 017 may form a part of the second dam structure 0152 as shown in FIGS. 6-7, 11, and 13-15.

In a case that the pattern of the second planarization layer 018 is located at the first region 04 and/or the second region 06, the pattern of the second planarization layer 018 may form a part of the first dam structure 0151 as shown in FIGS. 6-7, 10-11, and 13-16. In a case that the pattern of the second planarization layer 018 is located at the third region 07, the pattern of the second planarization layer 018 may form a part of the second dam structure 0152 as shown in FIGS. 6-7, 11, and 13-15.

In a case that the pattern of the pixel definition layer 012 is located at the first region 04 and/or the second region 06, the pattern of the pixel definition layer 012 may form a part of the first dam structure 0151 as shown in FIGS. 6-7, 10-11, and 13-16. In a case that the pattern of the pixel definition layer 012 is located at the third region 07, the pattern of the pixel definition layer 012 may form a part of the second dam structure 0152 as shown in FIGS. 6-7, 11, and 13-15.

In a case that the pattern of the spacer 019 is located at the first region 04 and/or the second region 06, the pattern of the spacer 019 may form a part of the first dam structure 0151 as shown in FIGS. 6-7, 10-11, and 13-16. In a case that the pattern of the spacer 019 is located at the third region 07, the pattern of the spacer 019 may form a part of the second dam structure 0152 as shown in FIGS. 6-7, 11, and 13-15.

In summary, with the method for manufacturing the display substrate provided by the embodiments of the present disclosure, the second dam portion 015 can be manufactured on at least one side of the display region, so that the ability of the display substrate for blocking the ink overflowing from the display region can be improved, and the manufacturing yield of the display substrate can be improved on the basis of reducing the frame size of the display substrate.

While the present disclosure has been described with reference to specific embodiments thereof, it will be understood by those skilled in the art that various changes may be made and equivalents may be substituted for elements thereof without departing from the scope of the disclosure. Accordingly, the protection sought herein is as set forth in the claims below.

What is claimed is:

1. A display substrate, comprising:

a base substrate, wherein the base substrate comprises a display region and a frame region surrounding the display region;

a first dam portion, located at the frame region and surrounding the display region; and a second dam portion, located at the frame region, wherein a maximum width of the second dam portion in a direction perpendicular to an extending direction of the second dam portion, is less than a maximum width of the first dam portion in a direction perpendicular to an extending direction of the first dam portion, and the second dam portion is located at a side of the first dam portion adjacent to the display region;

wherein a low-voltage signal line is arranged at the frame region, the frame region comprises a first region and a second region, an end portion of the low-voltage signal line is located at the first region and the second region, the first region and the second region are symmetrical with respect to the display region, and the second dam portion comprises a first dam structure arranged at the first region and/or the second region.

2. The display substrate according to claim 1, wherein the frame region further comprises a third region located between the first region and the second region, and the second dam portion further comprises a second dam structure extending from the first region to the second region via the third region.

3. The display substrate according to claim 1, wherein the display substrate comprises a pixel definition layer, an orthographic projection of the pixel definition layer onto the base substrate does not overlap with a partial area of the first region; and/or the orthographic projection of the pixel definition layer onto the base substrate does not overlap with a partial area of the second region.

4. The display substrate according to claim 3, wherein the first region comprises a first sub-region where the first dam structure is located and a second sub-region outside the first sub-region, and the orthographic projection of the pixel definition layer onto the base substrate does not overlap with the second sub-region; and/or the second region comprises a third sub-region where the first dam structure is located and a fourth sub-region outside the third sub-region, and the orthographic projection of the pixel definition layer onto the base substrate does not overlap with the fourth sub-region.

5. The display substrate according to claim 2, wherein an extending direction of the second dam structure is parallel or substantially parallel to an extending direction of the first dam portion at the third region.

6. The display substrate according to claim 2, wherein the end portion of the low-voltage signal line comprises a first edge at a side adjacent to the first dam portion, the first dam structure comprises a first portion, an orthographic projection of the first portion onto the base substrate covers an orthographic projection of the first edge onto the base substrate, and an extending direction of the first portion is parallel or substantially parallel to an extending direction of the first edge.

7. The display substrate according to claim 2, wherein the end portion of the low-voltage signal line comprises a second edge at a side adjacent to the third region, the first dam structure comprises a second portion, an orthographic projection of the second portion onto the base substrate covers an orthographic projection of the second edge onto the base substrate, and an extending direction of the second portion is parallel or substantially parallel to an extending direction of the second edge.

8. The display substrate according to claim 2, wherein a gap portion is arranged at a side of the end portion of the low-voltage signal line adjacent to the third region, the first dam structure comprises a third portion, an orthographic projection of the third portion onto the base substrate covers an orthographic projection of a third edge of the gap portion onto the base substrate, and an extending direction of the third portion is parallel or substantially parallel to an extending direction of the third edge.

9. The display substrate according to claim 8, wherein the gap portion comprises a fourth edge and a fifth edge which are parallel or substantially parallel to the first dam portion, and the second dam structure comprises a fourth portion extending in an extending direction of the fourth edge and/or a fifth portion extending in an extending direction of the fifth edge.

10. The display substrate according to claim 8, wherein the gap portion is rectangular.

11. The display substrate according to claim 10, wherein a width of the gap portion ranges from 10 micrometers to 60 micrometers, and a length of the gap portion ranges from 200 micrometers to 5000 micrometers.

12. The display substrate according to claim 1, wherein a height of the second dam portion in a direction perpendicular to the base substrate is less than or equal to a height of the first dam portion in the direction perpendicular to the base substrate.

13. The display substrate according to claim 1, wherein the display substrate comprises a first planarization layer, a second planarization layer, a pixel definition layer and a spacer which are located at the frame region and stacked in sequence; and the second dam portion is formed by the first planarization layer, the second planarization layer, and the pixel definition layer; or the second dam portion is formed by the first planarization layer, the second planarization layer, the pixel definition layer, and the spacer.

14. The display substrate according to claim 1, wherein the maximum width of the first dam portion in the direction perpendicular to the extending direction of the first dam portion ranges from 30 micrometers to 50 micrometers, and the maximum width of the second dam portion in the direction perpendicular to the extending direction of the second dam portion ranges from 10 micrometers to 50 micrometers.

15. The display substrate according to claim 14, wherein the maximum width of the second dam portion in the direction perpendicular to the extending direction of the second dam portion ranges from 15 micrometers to 30 micrometers.

16. The display substrate according to claim 1, wherein a length of the first dam structure is greater than 2000 micrometers.

17. A display substrate, comprising:

a base substrate, wherein the base substrate comprises a display region and a frame region surrounding the display region;

a first dam portion, located at the frame region and surrounding the display region;

a low-voltage signal line, arranged at the frame region, wherein the frame region comprises a first region and a second region, an end portion of the low-voltage signal line is located at the first region and the second region, the first region and the second region are symmetrical with respect to the display region, the frame region further comprises a third region located between the first region and the second region, and the low-voltage signal line is not arranged at the third region; and a second dam portion, at least located at the first region, the second region and/or the third region, wherein the second dam portion is located at a side of the first dam portion adjacent to the display region.

18. The display substrate according to claim 17, wherein a maximum width of the second dam portion in a direction perpendicular to an extending direction of the second dam portion is less than a maximum width of the first dam portion in a direction perpendicular to an extending direction of the first dam portion; and/or a length of the second dam portion in the extending direction of the second dam portion is less than a length of the first dam portion in the extending direction of the first dam portion.

19. A display device, comprising a display substrate, wherein the display substrate comprises:

a base substrate, wherein the base substrate comprises a display region and a frame region surrounding the display region;

a first dam portion, located at the frame region and surrounding the display region; and a second dam portion, located at the frame region, wherein a maximum width of the second dam portion in a direction perpendicular to an extending direction of the second dam portion, is less than a maximum width of the first dam portion in a direction perpendicular to an extending direction of the first dam portion, and the second dam portion is located at a side of the first dam portion adjacent to the display region;

wherein a low-voltage signal line is arranged at the frame region, the frame region comprises a first region and a second region, an end portion of the low-voltage signal line is located at the first region and the second region, the first region and the second region are symmetrical with respect to the display region, and the second dam portion comprises a first dam structure arranged at the first region and/or the second region.

* * * * *